(12) United States Patent
Christie et al.

(10) Patent No.: US 10,634,743 B2
(45) Date of Patent: Apr. 28, 2020

(54) SAMPLE TUBE INSERTION GUIDE DEVICE

(71) Applicant: ARIZONA BOARD OF REGENTS ON BEHALF OF THE UNIVERSITY OF ARIZONA, Tucson, AZ (US)

(72) Inventors: Hamish S. Christie, Tucson, AZ (US); Lee Macomber, Tucson, AZ (US)

(73) Assignee: Arizona Board of Regents on behalf of the University of Arizona, Tucson, AZ (US)

(*) Notice: Subject to any disclaimer, the term of this patent is extended or adjusted under 35 U.S.C. 154(b) by 0 days.

(21) Appl. No.: 15/729,511

(22) Filed: Oct. 10, 2017

(65) Prior Publication Data

US 2018/0100904 A1  Apr. 12, 2018

Related U.S. Application Data

(60) Provisional application No. 62/406,193, filed on Oct. 10, 2016.

(51) Int. Cl.
*G01R 33/30* (2006.01)
*G21C 19/20* (2006.01)

(52) U.S. Cl.
CPC .......... *G01R 33/307* (2013.01); *G21C 19/20* (2013.01)

(58) Field of Classification Search
USPC ........................................ 324/321
See application file for complete search history.

(56) References Cited

U.S. PATENT DOCUMENTS

| 5,851,397 | A | * | 12/1998 | Itoh | B01D 21/2444 210/517 |
| 6,867,594 | B2 | * | 3/2005 | Fey | G01R 33/307 324/321 |
| 7,064,549 | B1 | * | 6/2006 | Hudson | G01R 33/3628 324/318 |
| 7,119,542 | B1 | * | 10/2006 | Howard | G01R 33/307 324/321 |
| 7,132,829 | B2 | * | 11/2006 | Hudson | G01R 33/3635 324/318 |
| 2002/0196022 | A1 | * | 12/2002 | Tschirky | G01R 33/307 324/321 |
| 2002/0196023 | A1 | * | 12/2002 | Hofmann | G01R 33/30 324/321 |

(Continued)

FOREIGN PATENT DOCUMENTS

ES     2010-E17532     *    3/2010    .......... A47G 29/087

*Primary Examiner* — Jay Patidar
(74) *Attorney, Agent, or Firm* — Don D. Cha; HDC IP Law, LLP

(57) ABSTRACT

The present invention provides a sample tube insertion guide that is adapted in reducing the possibility or the risk of breakage of a sample tube that is inserted into an orifice during insertion/removal of the sample tube through an orifice. In one particular embodiment, the sample tube insertion guide comprises:
- a plurality of rigid elongated guide elements (14), each of which comprises a top end (18T) and a bottom end (18B); and
- one or more slotted openings (38) between at least a pair of said rigid elongated guide elements (14), wherein said slotted openings (38) begin at the top end (18T) and extend continuously to at least 75% of the length of said rigid elongated guide elements (14).

14 Claims, 4 Drawing Sheets

(56) References Cited

U.S. PATENT DOCUMENTS

| | | | |
|---|---|---|---|
| 2003/0164703 A1* | 9/2003 | Ferris | A61B 5/0555 |
| | | | 324/318 |
| 2005/0062474 A1* | 3/2005 | Tschirky | G01R 33/30 |
| | | | 324/321 |
| 2006/0226839 A1* | 10/2006 | Howard | G01R 33/307 |
| | | | 324/321 |
| 2007/0202017 A1* | 8/2007 | Himmelsbach | G01R 33/307 |
| | | | 422/527 |
| 2008/0150534 A1* | 6/2008 | Takahashi | B01F 5/0646 |
| | | | 324/321 |
| 2015/0002152 A1* | 1/2015 | Schmidig | G01R 33/307 |
| | | | 324/318 |
| 2018/0008804 A1* | 1/2018 | Laniado | A61M 25/0017 |

* cited by examiner

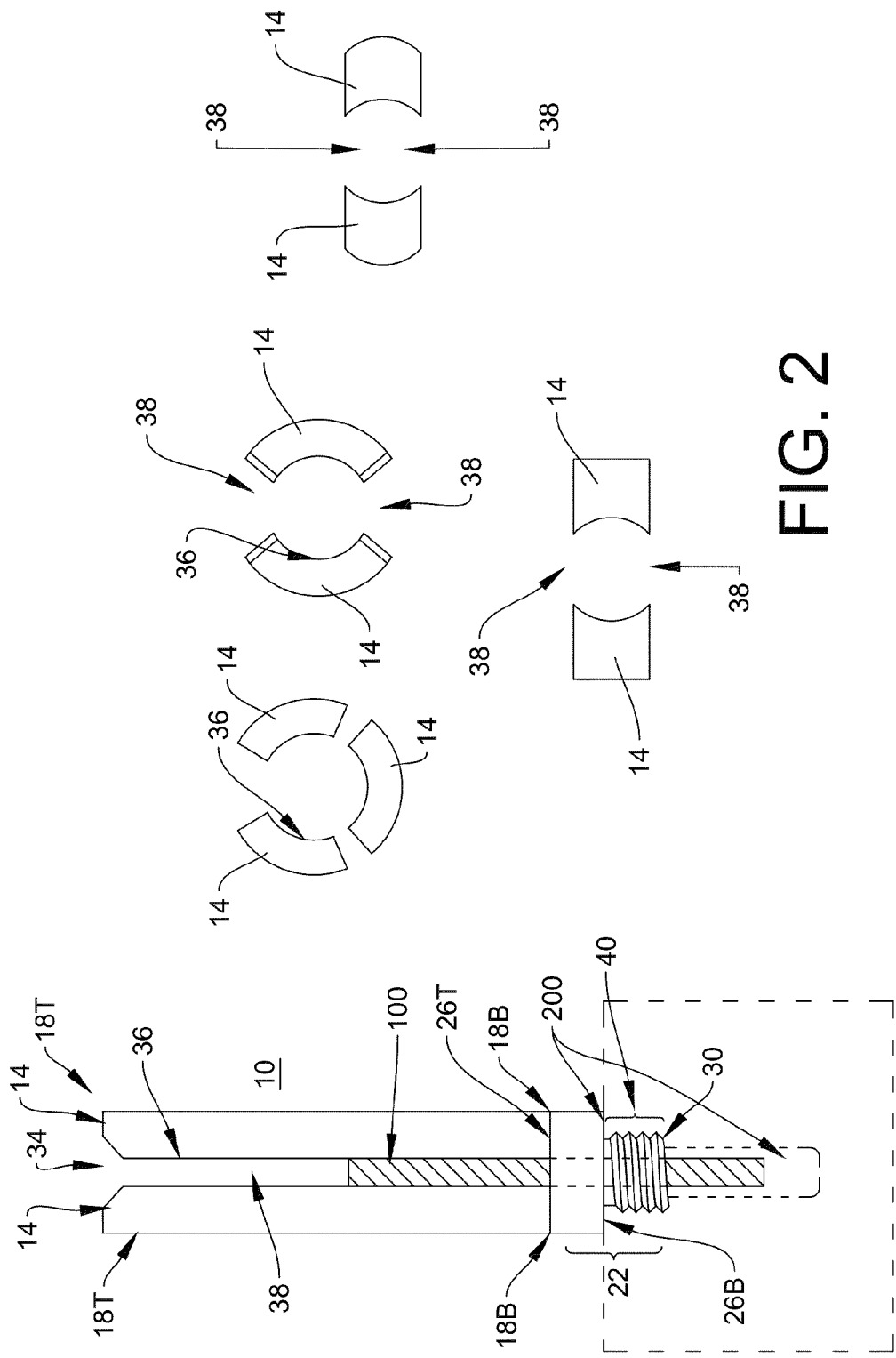

FIG. 3

NMR TUBE 7.24 LONG    HEAD DIA .344    GLASS DIA .194 (5mm)

10A
22A
26AB
40A
30A
1/2-20 THD X .28 LONG
.50 .28
22A
18AB
.875 DIA
26AT
38A
46A
14A
18AT
34A
8.18 O.A.L.
.177 / .125
*

TUBE INSTALLED HEIGHT
1.125"

FIG. 5

42A
102
38A
104
300
14A
.348 / .344 DIA THRU

.06" THICK SILICON GASKET CENTER SLIT TO ACCEPT GLASS TUBE, GLUED TO "SHELF"
GAP SMALLER THAN TUBE DIAMETER

TEFLON INSERT, PRESS FIT .209 I.D., .6" LONG CHAMFER 1 END

SAMPLE TUBE INSERTION GUIDE DEVICE

CROSS-REFERENCE TO RELATED APPLICATIONS

This application claims the priority benefit of U.S. Provisional Application No. 62/406,193, filed Oct. 10, 2016, which is incorporated herein by reference in its entirety.

FIELD OF THE INVENTION

The present invention relates to a device for guiding an item, such as a sample or a sample container, into a device. Such an insertion guide device is useful in various situations, including, but not limited to, (i) inserting a nuclear magnetic resonance (NMR) sample tube into a NMR instrument, thereby reducing the possibility or the risk of breakage of an NMR sample tube; (ii) inserting nuclear fuel rods into a nuclear reactor; and (iii) oil well sleeves for drilling and/or inserting oil well drills or pipes.

BACKGROUND OF THE INVENTION

A wide variety of situations require inserting an item into an orifice. Sometimes these items are delicate and/or require a relatively precise means for inserting such an item into an orifice. For example, inserting nuclear fuel rods into a nuclear reactor, and inserting oil well sleeves to an oil well. Without an insertion guide device, such a situation will require delicate manipulation and precise insertion of the sample or an item to be inserted, thereby often increasing the time and labor cost as well as increasing the risk of potential accidents or disasters.

For example, in chemistry, NMR is an indispensable analytical method. NMR is routinely used in organic chemistry for compound identification and analysis. High-field NMR instruments are expensive and require continuous maintenance. Consequently at universities their regular use is mostly limited to research purposes.

In the last few years several companies have begun producing benchtop NMR spectrometers. When used at universities, these benchtop NMR instruments enable more undergraduate students to have direct experience with using this vital analysis method. These benchtop spectrometers have sleek designs and many excellent features.

However, one of the major problems that exists involves accidental breakage of NMR sample tubes, which are made of glass, that are used with these Instruments. The long, thin, and fragile tubes are inserted into the top of the instrument and breakages occur regularly with inexperienced users (e.g., undergraduate students in large lab classes). While the breakage typically does not damage the instrument, the process of removing broken glass then cleaning and recalibrating the instrument requires many hours. Aside from the time and labor to get the instrument operational, a sample breakage effectively removes the instrument from service for the remainder of a lab session (or longer).

Therefore, there is a need for an insertion guide device that facilitates or makes it easier to insert a sample or an item (such as a sample container, oil well sleeve, nuclear fuel rod, etc.) into an orifice. Such a device would significantly reduce, prevent or minimize accidental breakage of an item to be inserted and also would significantly reduce the time and labor for inserting such an item into an orifice.

SUMMARY OF THE INVENTION

The present invention provides a device that attaches to the top of an orifice for inserting an item through the orifice. The insertion guide device of the invention can be configured and adapted for use in any situation where an item is to be placed within an orifice, including but not limited to, situations such as (i) placing a nuclear fuel rod into a nuclear reactor, (ii) placing a sleeve into an oil well (e.g., for oil production, oil well drilling, etc.), and (iii) placing a sample or a sample container into an analytical instrument.

One aspect of the invention provides an insertion guide device (10) adapted to facilitate insertion of an item (100) into an orifice (200), said insertion guide device (10) comprising:

a plurality of rigid elongated guide elements (14), each of which comprises a top end (18T) and a bottom end (18B); and an adapter fitting portion (22) comprising a top surface (26T), a bottom surface (26B), and an adapter orifice (30) adapted for allowing insertion of the item (100) to be inserted into the orifice (200), wherein each of said bottom end (18B) of said plurality of rigid elongated guide elements (14) is attached to the top surface (26T) of said adapter fitting portion (22), and wherein said bottom surface (26B) of said adapter fitting portion (22) comprises a fitting element (40) that is adapted to fit within the orifice (200), wherein said plurality of rigid elongated guide elements (14) together forms:
  an insertion guide device orifice (34) at the top end (18T) of said plurality of rigid elongated guide elements (14);
  an inner surface (36) that is shaped and adapted to fit the item (100) within said insertion guide device (10);
  one or more slotted openings (38) between at least a pair of said rigid elongated guide elements (14) that is adapted to allow guiding the item (100) into said orifice (200).

In one particular embodiment, the device is adapted to be used in inserting an NMR sample tube into an NMR instrument. Use of such insertion guide device significantly reduces or prevents the possibility or the likelihood of breaking the NMR sample tube during placement of the NMR sample tube into the NMR instrument. In particular, the insertion guide device of the invention guides the NMR sample tube in such a way that it effectively reduces or eliminates the risk or the possibility to break the NMR sample tube when the NMR sample tube is inserted into the NMR instrument. The device is simple and easy to understand and use. Device of the invention has no moving parts and accommodates an NMR sample tube for a benchtop NMR Instrument.

BRIEF DESCRIPTION OF THE DRAWINGS

FIG. 1 is a side view of an insertion guide device of the present intention.

FIG. 2 is a top view of a various guide device configurations having two or three rigid elongated guide elements.

FIG. 3 shows a typical NMR sample tube.

FIG. 4 shows one embodiment of a side-view of the device of the invention.

FIG. 5 shows a top-view of one embodiment of the device of the invention.

FIG. 6 is a side-view of an optional NMR tube guide insert of the invention.

FIG. 7 is a top-view of an optional gasket for a device of the invention.

DETAILED DESCRIPTION OF THE INVENTION

Figure 8:
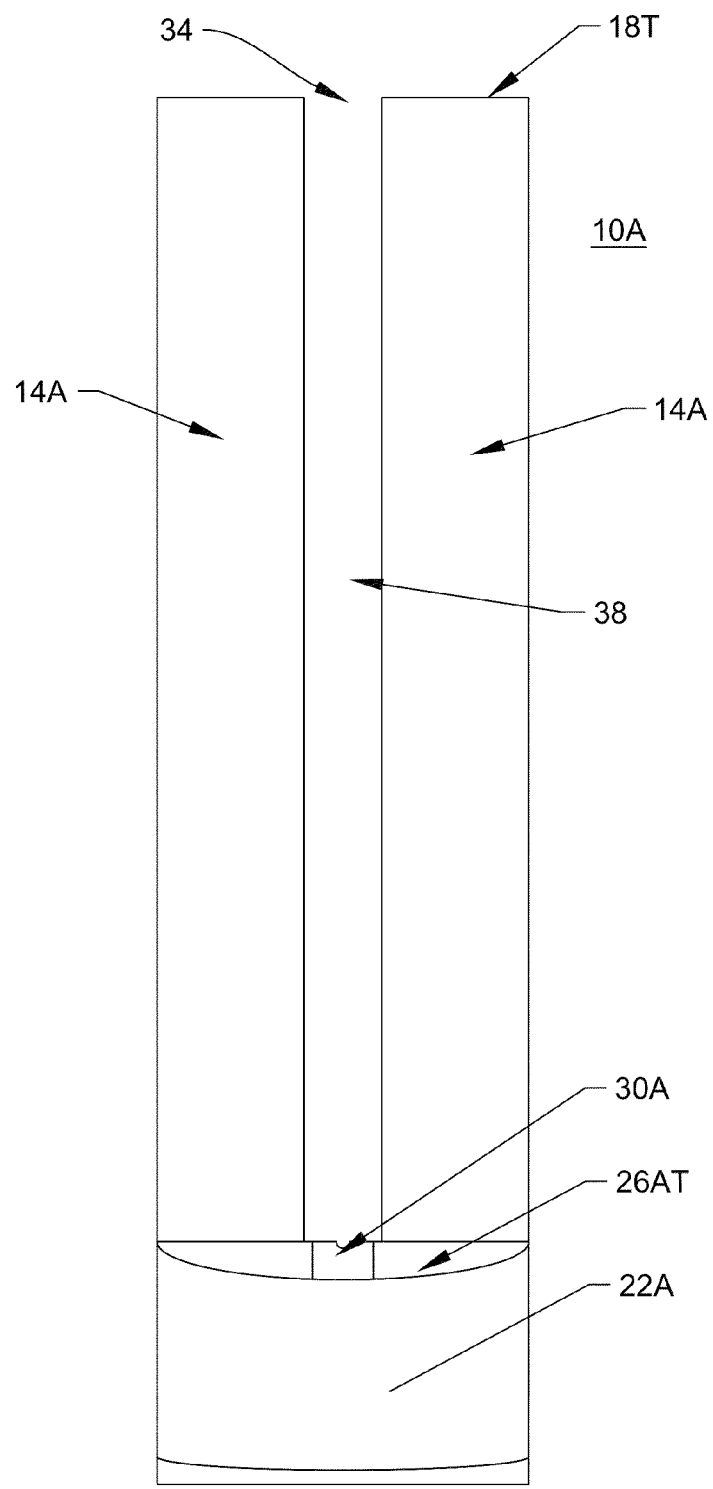
FIG. 8 is a photo of a side-view of an NMR sample tube insertion guide device of the invention.

The present invention will now be described with regard to the accompanying drawings, which assist in illustrating various features of the invention. In this regard, the present invention generally relates to inserting an item (such as a oil well sleeve, NMR sample tube, nuclear reactor fuel rods, etc.) into an orifice. However, for the sake of clarity and brevity, the present invention will now be described in reference to inserting an NMR sample tube to an NMR instrument.

While the remainder of the present disclosure is directed to an insertion guide device that is adapted for facilitating insertion of an NMR sample tube to an NMR instrument, one skilled in the art having read the present disclosure can readily recognize that the scope of the invention is not limited to an insertion guide device for inserting an NMR sample tube to an NMR instrument. As stated above, methods and devices of the invention can be used generally in any situation where an item is inserted into an orifice, including but not limited to, inserting nuclear fuel rods into a nuclear reactor and oil well sleeves for drilling and/or inserting oil well drills or pipes.

Accordingly, the following discussion for inserting an NMR sample tube in to an NMR instrument using the insertion guide device of the invention is provided solely for the purpose of illustrating the practice of the invention and does not constitute limitations on the scope of the present invention.

Some illustrative embodiments of insertion guide device, in particular NMR sample tube insertion guide device of the invention are generally shown in FIGS. 1-9, which are provided for the purpose of illustrating the practice of the present invention and do not constitute limitations on the scope thereof.

Referring to FIGS. 1-9, in particular FIG. 1, one aspect of the invention provides an insertion guide device (10) adapted to facilitate insertion of an item (100) into an orifice (200). In one particular embodiment, the insertion guide device (10) comprises a plurality of rigid elongated guide elements (14), each of which comprises a top end (18T) and a bottom end (18B). The number of rigid elongated guide elements is typically two to five, often two to four, more often two or three, and most often two. However, it should be appreciated that the number of rigid elongated guide elements (14) is not limited to these numbers. Any number of rigid elongated guide elements can be used in the present invention as long as it achieves the desired function of maintaining the item (100) to be inserted into the orifice (200) within the interior of the space formed by the plurality of rigid elongated guide elements (14).

The insertion guide device of the invention further can include an adapter fitting portion (22) that comprises a top surface (26T), a bottom surface (26B), and an adapter orifice (30) adapted for allowing insertion of the item (100) to be inserted into the orifice (200). Each of the bottom end (18B) of the plurality of rigid elongated guide elements (14) is attached to the top surface (26T) of the adapter fitting portion (22). The bottom surface (26B) of the adapter fitting portion (22) can also include a fitting element (40) that is adapted to fit within the orifice (200), In some embodiments, the plurality of rigid elongated guide elements (14) together forms an insertion guide device orifice (34) at the top end (18T) of the plurality of rigid elongated guide elements (14); an inner surface (36) that is shaped and adapted to fit the item (100) within said insertion guide device (10); and one or more slotted openings (38) between at least a pair of said rigid elongated guide elements (14) that is adapted to allow guiding the item (100) into said orifice (200).

In some embodiments, the insertion guide device (10) consists of two elongated guide elements (14). In other embodiments, the insertion guide device (10) consists of two slotted openings (38). These slotted openings (38) are located substantially in opposite positions.

As stated herein, the insertion guide device (10) can be configured or adapted for placing a sleeve in an oil production well or for placing a nuclear fuel rod in a nuclear reactor.

In some embodiments, the present invention provides an NMR sample insertion guide device for guiding a nuclear magnetic resonance (NMR) sample tube into a nuclear magnetic resonance (NMR) instrument. See, in particular FIGS. 3-9. Typically, the device of the invention is adapted to be used with a benchtop NMR instrument. A wide variety of benchtop NMR instruments are commercially available, such as from Oxford Instruments (Pulsar and MQC-23, see, for example, oxford-instruments.com/products/spectrometers/nuclear-magnetic-resonance-nmr/pulsar), Anasazi Instruments (see, for example, try.aiinmr.com/top-performance-nmr-spectrometer/?gclid=CPWqpoqcyc8CFY07gQodo0wK8w), Nanalysis Corp. (nanalysis.com), Magritek Co. (magritek.com), etc. See, also, en.wikipedia.org/wiki/Benchtop nuclear_magnetic_resonance_spectrometer.

In one specific embodiment, the present invention generally relates to an NMR sample tube insertion guide device to reduce the risk or the possibility of an NMR sample tube breakage during insertion/retrieval of an NMR sample tube from an NMR instrument. That is, the invention relates to a device that attaches to the top of a benchtop NMR spectrometer instrument.

A typical NMR sample tube is shown in FIG. 3. As can be seen, an NMR sample tube comprises a glass tube 104 that holds an NMR sample and a cap 102 that prevents the spillage of sample. A typical NMR sample tube has a diameter of 5 mm and is about 7 inches (7.24 inches with a cap) long. It should be appreciated that the NMR sample tube diameter is predetermined by the NMR instruments. As for the length of the NMR sample tube, it can vary. Some embodiments of NMR sample tube guide devices are illustrated in FIGS. 3-9, which illustrate various elements of the insertion guide device of the invention and are provided solely for the purpose of illustrating the practice of the present invention and do not constitute limitations on the scope thereof.

Referring to FIGS. 3-9, an NMR sample tube insertion guide device (10A) of the invention comprises a plurality of rigid elongated devices (14A). The NMR sample tube insertion guide device (10A) is adapted for guiding a nuclear magnetic resonance (NMR) sample tube (100A) into a nuclear magnetic resonance (NMR) instrument (200A), thereby reducing the possibility or the risk of breakage of an NMR sample tube (100A). By using the insertion guide device of the present invention, it is believed the amount (or the rate) of breakage of an NMR sample tube per 1,000,000 usage can be reduced by at least 25%, typically by at least 50%, often by at least 75%, and more often by at least 90%.

Each of the plurality of rigid elongated devices (14A) includes a top end (18AT) and a bottom end (18AB). The NMR sample tube insertion guide device (10) also includes an adapter fitting portion (22A). The adapter fitting portion (22A) comprises a top surface (26AT), a bottom surface (26AB), and an adapter orifice (30A) adapted for allowing insertion of the NMR sample tube (100A) to be inserted into the NMR instrument (200A). Each of the bottom end (18AB) of the plurality of rigid elongated guide elements (14A) is attached to the top surface (26AT) of the adapter fitting portion (22A). In addition, the bottom surface (26AB) of the adapter fitting portion (22A) includes a fitting element (40A) that is adapted to fit within the NMR instrument (200A).

In some embodiments, the plurality of rigid elongated guide elements (24A) together forms: an NMR tube insertion orifice (34A) at the top end (18AT) of the plurality of rigid elongated guide elements (14A); an inner surface (36A) that is shaped and adapted to fit the NMR sample tube (100A) and the NMR sample tube cap (102) within said insertion guide device (10A); and one or more slotted openings (38A) between at least a pair of the rigid elongated guide elements (14A) that is adapted to allow guiding the NMR sample tube (100A) into said NMR instrument (200A). The presence of the slotted opening (38A) within the length of the rigid elongated guide elements (14A) reduces or prevents the possibility or the risk of the NMR sample tube (100A) breakage when inserting the NMR sample tube (100A) into the NMR instrument (200A). In some instances, at least 75%, often at least 80% more often at least about 90%, and most often by at least 95% of the length of the rigid elongated guide elements (14A) comprise the slotted opening (38A). Typically, the gap size of the slotted opening (38A) is less than the diameter of the NMR sample tube (100A). This prevents insertion or removal of the NMR tube (100A) through the slotted opening (38A) and allows insertion/removal of the NMR tube (100A) only through the NMR tube insertion orifice (34A). As can be seen in FIG. 5, in one embodiment, the outer surface (42A) of each of the rigid elongated guide elements (14A) device forms a portion of cylindrical shape. However, it should be appreciated that the scope of the invention is not limited to having the outer surface (42A) forming a portion of cylinder. It can be any shape. In particular, the outer surface (42A) can be a straight line or an arc (as in cylindrical shape) or a combination thereof as well as any other configuration.

The adapter fitting portion (22A) includes a fitting element (40A) that is adapted to fit within an NMR sample tube insert portion of an NMR instrument (200A). As can be seen, in one embodiment, the fitting element (40A) is threaded such that the top of the sample tube insert portion of an NMR instrument (200A) can be removed and fitted with the NMR sample tube insertion guide device (10A). Alternatively, the fitting element (40A) can be non-threaded but simply fits snugly within the sample tube insert portion of an NMR instrument (200A). However, it should be appreciated that any mechanism known to one skilled in the art can be used to fit the NMR sample tube insertion guide device (10A) rigidly into the sample tube insert portion of an NMR instrument (200A).

As can be seen in FIGS. 4 and 5, in some embodiments the NMR sample tube insertion guide device (10A) has two rigid elongated guide elements (14A) or posts or prongs.

Referring in particular to FIGS. 4 and 5, the rigid elongated guide elements (14A) form a bore or an "inner surface" 46A (indicated by the dashed lines in FIG. 4) of the NMR sample tube insertion guide device (10A). While the outer surfaces 42A of the rigid elongated guide elements (14A) shown in FIG. 5 are arcs, it should be appreciated that the outer surfaces of the rigid elongated guide elements (14A) can be flat or any other shape. In addition, the outer surface shapes of each of the rigid elongated guide elements (14A) can be different. Furthermore, the shape and the thickness of each of the rigid elongated guide elements (14A) can be same or different. In general, however, the length of each of the rigid elongated guide elements (14A) are substantially similar, i.e., less than 5%, typically less than 3%, often less than 1% difference in length.

In FIG. 4, the length of the rigid elongated guide elements (14A) are shown as 8.18 inches long to accommodate a typical NMR sample tube (100A) having the length of about 7.24 inches or less. The diameter of the bore or the inner surface (46A) is such that it is slightly larger than or equal to the size of a standard NMR cap (102) to allow insertion of an NMR sample tube (100A) through the bore or the inner surface 46A of the NMR sample tube insertion guide device (10A). The NMR tube insertion orifice (34A) located at the top end (18AT) of the plurality of rigid elongated guide elements (14A) is used for inserting an NMR sample tube (100A). In one particular embodiment as illustrated in FIG. 4, the NMR tube insertion orifice (34A) is conically shaped to aid in insertion of an NMR sample tube (100A). However, it should be appreciated that the entry point of NMR tube insertion orifice (34A) need not be conically shaped.

The NMR sample tube insertion guide device (10A) also has a gap or a slotted opening (38A) between each of the plurality of rigid elongated devices (14A). The gap or the slotted opening (38A) is smaller than the diameter of an NMR sample tube (100A). In this manner one can only insert an NMR sample tube (100A) through the NMR tube insertion orifice (34A). The gap or the slotted opening (38A) also allows one to grasp or hold an NMR sample tube (100A) and lower or guide it into an NMR instrument. The slotted opening (38A) is of sufficient length to allow a user to hold and guide an NMR sample tube (100A) into an NMR instrument (200A).

FIGS. 5 and 6 show an optional gasket (300) that can be placed near the adapter fitting portion (22A). Typically, the optional gasket (300) is placed on the top surface (26AT) of the adapter fitting portion (22A). More typically, the gasket (300) is placed just above the NMR sample tube insert portion of an NMR instrument (200A). The gasket (300) can include a resealable and/or flexible opening or a slit (304) that is typically an X- or Y-shaped. This gasket (300) prevents any glass or material from entering the NMR sample insert area in case of accidental breakage of an NMR sample tube (100A) during insertion or removal.

Figure 9:
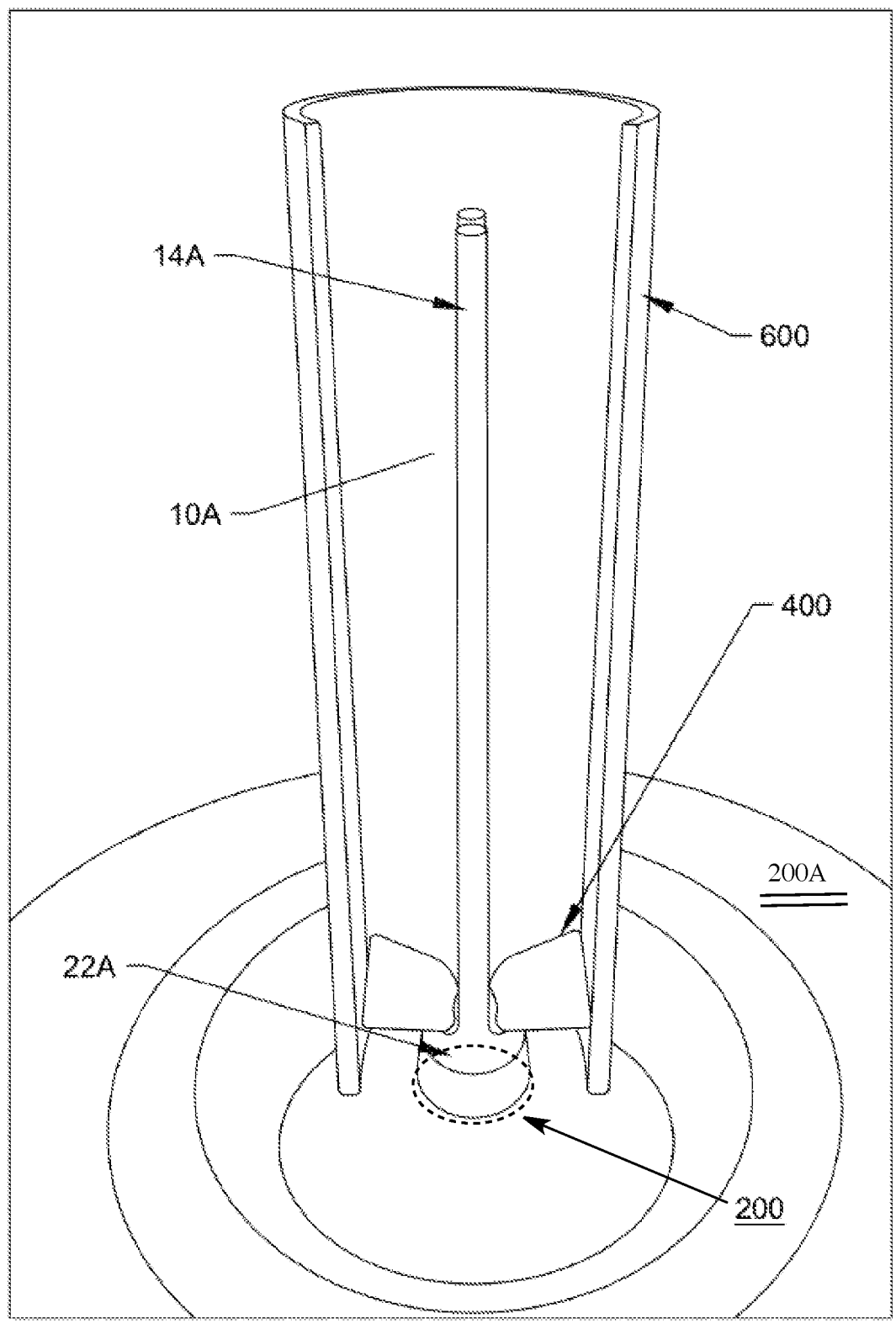
FIG. 9 is a photo of a perspective view of an NMR sample tube insertion guide device of the invention that is placed on an NMR instrument.

As shown in FIG. 9, in one particular embodiment, the NMR sample tube insertion guide device (10A) can also include a flange (400) or a set of flanges (400) near the adapter fitting portion (22A), typically on the top surface (26AT) of the adapter fitting portion (22A). The presence of this flange (400) or a set of flanges (400) further provides guiding mechanism for placing an NMR sample tube (100A) into an NMR sample insertion port of the NMR instrument (200A).

Yet in another embodiment, an NMR tube guiding element (500) (see FIG. 7) can be inserted into the adapter orifice (30A) in the adapter fitting portion (22A) or near at the top surface (26AT) of the adapter fitting portion (22A). Alternatively, the guiding element (500) can be placed within the bore or the inner surface (46A) of the NMR sample tube guiding device (10A). As can be seen in FIG. 7, the top of the inner surface of the NMR tube guiding element (500) can be conically shaped (see dashed lines) in order to facilitate insertion of an NMR sample tube (100A) into an NMR sample insertion port of the NMR instrument (200A).

Still in another embodiment, the NMR sample tube insertion guiding device (10A) can also include a shield portion (600) that surrounds more than 180° but less than 360° of the plurality of rigid elongated devices (14A). See FIG. 9. The presence of this shield portion (500) further prevents a user from inserting an NMR sample tube (100A) through the gap or the slotted opening (38A) but allows a user to hold an NMR sample tube (100A) or the NMR sample tube cap (102) thereby allowing the user to place the NMR sample tube (100A) into NMR tube insertion orifice (34A) at the top end (18AT) of the plurality of rigid elongated guide elements (14A) while allowing the user to guide the NMR sample tube (100A) into the NMR sample entry or insertion port of the NMR instrument (200A).

The NMR sample tube insertion guide device (10A) should be rigid to prevent any bending when a pressure is applied. Therefore, the NMR sample tube insertion guide device (10A) (at least the posts or the plurality of rigid elongated devices (14A)) is made of a material comprising a metal, a hard polymer, a ceramic, a metal alloy or a combination thereof. Suitable materials include aluminum, high-density polyethylene (HDPE), ultra-high molecular weight polyethylene (UHMWPE), polyphenol ether (PPE), or other rigid polymers.

The foregoing discussion of the invention has been presented for purposes of illustration and description. The foregoing is not intended to limit the invention to the form or forms disclosed herein. Although the description of the invention has included description of one or more embodiments and certain variations and modifications, other variations and modifications are within the scope of the invention, e.g., as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter. All references cited herein are incorporated by reference in their entirety.

What is claimed is:

1. An insertion guide device (10) configured to facilitate insertion of a sample holder (100) into a sample holding orifice (200) of an analytical instrument, said insertion guide device (10) comprising:
    a plurality of rigid elongated guide elements (14), each of which comprises a top end (18T) and a bottom end (18B), wherein the length of said rigid elongated guide elements (14) is not less than the length of said sample holder (100); and
    an adapter fitting portion (22) comprising a top surface (26AT), a bottom surface (26AB), and an adapter orifice (30), wherein each of said bottom end (18B) of said plurality of rigid elongated guide elements (14) is attached to the top surface (26T) of said adapter fitting portion (22), and wherein said bottom surface (26B) of said adapter fitting portion (22) comprises a fitting element (40) configured to attach said insertion guide device to said sample holding orifice (200),
    wherein said plurality of rigid elongated guide elements (14) together forms
        an insertion guide device orifice (34) at the top end (18T) of said plurality of rigid elongated guide elements (14);
        an inner surface (36);
        one or more slotted openings (38) between at least a pair of said rigid elongated guide elements (14), wherein said slotted openings (38) begin at the top end (18T) and extend continuously to at least 75% of the length of said rigid elongated guide elements (14).

2. The insertion guide device (10) of claim 1, wherein said insertion guide device (10) consists of two elongated guide elements (14).

3. The insertion guide device (10) of claim 1, wherein said insertion guide device (10) consists of two slotted openings (38).

4. A device (10A) for guiding a nuclear magnetic resonance (NMR) sample tube into a nuclear magnetic resonance (NMR) instrument (200A), thereby reducing the possibility or the risk of breakage of an NMR sample tube, said device comprising:
    a plurality of rigid elongated guide elements (14A), each of which comprises a top end (18AT) and a bottom end (18AB), wherein the length of the NMR sample tube is not longer than the length of said rigid elongated guide element (14A); and
    an adapter fitting portion (22A) comprising a top surface (26AT), a bottom surface (26AB), and an adapter orifice (30A) allowing insertion of the NMR sample tube to be inserted into the NMR instrument (200A), wherein each of said bottom end (18AB) of said plurality of rigid elongated guide elements (14A) is attached to the top surface (26AT) of said adapter fitting portion (22A), and wherein said bottom surface (26AB) of said adapter fitting portion (22A) comprises an fitting element (40A),
    wherein said plurality of rigid elongated guide elements (24A) together forms:
        an NMR tube insertion orifice (34A) at the top end (18AT) of said plurality of rigid elongated guide elements (14A);
        an inner surface (36A) that is shaped to fit the NMR sample tube and the NMR sample tube cap (102) within said device (10A);
        one or more slotted openings (38A) between at least a pair of said rigid elongated guide elements (14A), wherein said slotted openings (38A) begin at the top end (19AT) and extend continuously to at least 75% of the length of said guide elements (14A),
    wherein the presence of said slotted opening (38A) within the length of said rigid elongated guide elements (14A) reduces or prevents the possibility or the risk of the NMR sample tube breakage when inserting the NMR sample tube (100A) into the NMR instrument (200A).

5. The device (10A) of claim 4, wherein a gap size of said slotted opening (38A) is less than the diameter of the NMR sample tube (100A), thereby preventing insertion or removal of the NMR tube through said slotted opening (38A).

6. The device (10A) of claim 4, wherein an outer surface (42A) of each of said rigid elongated guide elements (14A) device forms a portion of cylindrical shape.

7. The device (10A) of claim 4 further comprising a gasket (300) at or near said adapter fitting portion (22A), wherein said gasket (300) comprises a slit opening (304) such that said slit opening (304) remains substantially closed and prevents entry of any undesired debris but allows inserting of the NMR sample tube.

8. The device (10A) of claim 7, wherein said slit opening (304) is an X- or a Y-shape.

9. The device (10A) of claim 7, wherein said gasket (300) is located at or near the top surface (26A) of said adapter fitting portion (22A).

10. The device (10A) of claim 4, wherein said device (10A) is made of a material comprising a metal, a hard polymer, a ceramic, a metal alloy or a combination thereof.

11. The device (10A) of claim 10, wherein said device (10A) is made of a material comprising aluminum, high-density polyethylene (HDPE), ultra-high molecular weight polyethylene (UHMWPE), polyphenol ether (PPE), or other rigid polymers.

12. The device (10A) of claim 4 further comprising a flange (400) at or near said adapter fitting portion (22A) to further aid in guiding the NMR sample tube into the NMR instrument (200A).

13. The device (10A) of claim 4 further comprising a shield portion (600) that surround more than 180° but less than 360° of said plurality of rigid elongated guide elements (14A), wherein the presence of said shield portion (600) prevents a user from inserting the NMR sample tube through the slotted openings (38A) but allows a user to hold the NMR sample tube (100A) or the NMR sample tube cap (102) thereby allowing the user to place the NMR sample tube into said NMR tube insertion orifice (34A) and also allow guiding of the NMR sample tube into the NMR instrument (200A).

14. A device (10A) for guiding a nuclear magnetic resonance (NMR) sample tube into a nuclear magnetic resonance (NMR) instrument (200A), thereby reducing the possibility or the risk of breakage of an NMR sample tube, said device comprising:
   a plurality of rigid elongated guide elements (14A), each of which comprises a top end (18AT) and a bottom end (18AB), wherein said plurality of rigid elongated guide elements (14A) together forms:
      an NMR tube insertion orifice (34A) at the top end (18AT) of said plurality of rigid elongated guide elements (14A);
      an inner surface (36A) that is shaped to fit the NMR sample tube and the NMR sample tube cap (102) within said device (10A); and
      one or more slotted openings (38A) between at least a pair of said rigid elongated guide elements (14A) that allows guiding the NMR sample tube (100A) into said NMR instrument (200A);
   an adapter fitting portion (22A) comprising a top surface (26AT), a bottom surface (26AB), and an adapter orifice (30A) allowing insertion of the NMR sample tube to be inserted into the NMR instrument (200A), wherein each of said bottom end (18AB) of said plurality of rigid elongated guide elements (14A) is attached to the top surface (26AT) of said adapter fitting portion (22A), and wherein said bottom surface (26AB) of said adapter fitting portion (22A) comprises an fitting element (40A) that fits within the NMR instrument (200A), and
   shield portion (600) that surround more than 180° but less than 360° of said plurality of rigid elongated guide elements (14A), wherein the presence of said shield portion (600) prevents a user from inserting the NMR sample tube through the slotted openings (38A) but allows a user to hold the NMR sample tube or the NMR sample tube cap thereby allowing the user to place the NMR sample tube into the NMR instrument (200A),
wherein the presence of said slotted opening (38A) within the length of said rigid elongated guide elements (14A) reduces or prevents the possibility or the risk of the NMR sample tube breakage when inserting the NMR sample tube (100A) into the NMR instrument (200A).

* * * * *